United States Patent
Jang et al.

(10) Patent No.: US 7,772,828 B2
(45) Date of Patent: Aug. 10, 2010

(54) AUTOMATIC TEST EQUIPMENT CAPABLE OF HIGH SPEED TEST

(75) Inventors: Chul-woong Jang, Cheonan-si (KR); Seung-ho Jang, Cheonan-si (KR); Jae-il Lee, Yongin-si (KR); Young-jin Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 242 days.

(21) Appl. No.: 12/072,444

(22) Filed: Feb. 26, 2008

(65) Prior Publication Data

US 2008/0204066 A1    Aug. 28, 2008

(30) Foreign Application Priority Data

Feb. 27, 2007    (KR) .................. 10-2007-0019919

(51) Int. Cl.
*G01R 15/18* (2006.01)
(52) U.S. Cl. ................................... 324/127
(58) Field of Classification Search ............ None
See application file for complete search history.

(56) References Cited

U.S. PATENT DOCUMENTS

| 7,428,679 | B2 * | 9/2008 | Evans | 714/733 |
| 7,512,024 | B2 * | 3/2009 | Lee et al. | 365/201 |
| 2003/0208713 | A1 * | 11/2003 | Evans | 714/742 |
| 2007/0242697 | A1 * | 10/2007 | Caulfield | 370/469 |
| 2008/0106950 | A1 * | 5/2008 | Lee et al. | 365/189.03 |

FOREIGN PATENT DOCUMENTS

| JP | 2006-3239 A | 1/2006 |
| JP | 2006-30166 A | 2/2006 |
| KR | 10-2006-0021429 A | 3/2006 |

* cited by examiner

*Primary Examiner*—Jermele M Hollington
(74) *Attorney, Agent, or Firm*—Mills & Onello, LLP

(57) ABSTRACT

Automatic test equipment is capable of performing a high-speed test of semiconductor devices, with a low cost and high efficiency. The automatic test equipment (ATE) comprises: an ATE body configured to electrically test semiconductor devices; a field programmable gate array (FPGA) controlling drivers and comparators on the ATE; an accelerator connected to an output terminal of the FPGA and that doubles an operating frequency of the FPGA; and a decelerator connected to an output terminal of the FPGA and that converts an operating frequency of data transferred from the semiconductor device to the operating frequency of the FPGA.

18 Claims, 6 Drawing Sheets

AUTOMATIC TEST EQUIPMENT CAPABLE OF HIGH SPEED TEST

CROSS-REFERENCE TO RELATED PATENT APPLICATION

This application claims the benefit of Korean Patent Application No. 10-2007-0019919, filed on Feb. 27, 2007, in the Korean Intellectual Property Office, the disclosure of which is incorporated herein in its entirety by reference.

BACKGROUND OF THE INVENTION

1. Field of the Invention

Embodiments of the present invention relate to the electrical testing of semiconductor devices, and more particularly, to an automatic test equipment (ATE) used for electrically testing semiconductor devices.

2. Description of the Related Art

Semiconductor devices are produced in a wafer state, assembled into semiconductor packages, and electrically tested, before being delivered to users. Because semiconductor memory devices such as dynamic random access memory (DRAM) have gained high capacity, high speed, and many pins, the efficiency of their electrical test processes must be increased. To increase the efficiency of the electrical test processes, testers focus on higher speed testing and improvement of throughput time.

Test throughput time can normally be improved in a number of ways. One way is by controlling a test program. Another way is to increase the number of semiconductor memory devices that can be tested simultaneously, i.e. by testing an increased number of devices in parallel. Finally, improvement of throughput time can be achieved by performing a high-speed test in the hardware of the automatic test equipment. Embodiments of the present invention are directed to improving high-speed test efficiency in the hardware of the automatic test equipment.

FIG. 1 is a schematic block diagram of an automatic test equipment body for testing a typical semiconductor memory device.

Referring to FIG. 1, an electrical test is performed to screen defects generated in wafer manufacturing or assembling processes and to identify and remove the defective products. For such electrical tests, an automatic test equipment (ATE) includes an ATE body 100, a socket board 200 as an interface board, and a handler to effectively load a device under test (DUT) 300.

The ATE body 100 includes a tester processor 110 to control hardware components which are built into the ATE. The hardware components may be a programmable power supply 112, a direct current (DC) parameter measurement unit 114, an algorithmic pattern generator 116, a timing generator 118, a wave sharp formatter 120, and pin electronics 150 including a driver and a comparator. Accordingly, the ATE body 100 tests electrical functions of the DUT 300 which is connected to the pin electronics 150 through the socket board 200, while the hardware components communicate signals with each other according to test programs operating in the tester processor 110.

Meanwhile, a test program includes a DC test, an alternating current (AC) test, and a function test. The function test checks functions under actual operating conditions of a semiconductor memory device such as a DRAM. The function test writes input signals created by the algorithmic pattern generator 116, the timing generator 118 and the wave shape formatter 120 of the ATE 100, to the DUT 300, e.g. the DRAM (Write operation), and reads out the written data from the DRAM (Read operation) to identify a defective semiconductor device using a comparator, by comparing the output with the expected patterns.

FIG. 2 is a block diagram of a field programmable gate array (FPGA) controlling a driver and a comparator built into a conventional ATE body.

Referring to FIG. 2, in an electrical test for a DRAM, an ATE body controls signals of a driver 130 and a comparator 140 using a semiconductor device having a function of an FPGA 160. The FPGA 160 is an application specific integrated circuit (ASIC) type semiconductor device which can program logic circuits according to a user's demand.

Accordingly, when signal patterns are transferred from the algorithmic pattern generator 116 and the timing generator 118 to terminals of the driver 130 and the comparator 140 of the FPGA 160, the FPGA 160 controls and transfers the signals to DUT 300.

Typically, the FPGA 160 controls the driver 130 and the comparator 140, and thus the maximum operating frequency of the ATE cannot be greater than that of the FPGA 160. For example, if the maximum operating frequency of the FPGA 160 is 400 MHz, DDR2 or DDR3 type DRAM having a maximum operating frequency of more than 400 MHz cannot be electrically tested using this configuration. The capacitance of the semiconductor including FPGA circuits mainly prevent the maximum operating frequency of the FPGA 160 from being greater than 400 MHz in contemporary systems, which limits the capability of ATE systems.

SUMMARY OF THE INVENTION

Embodiments of the present invention provide an automatic test equipment (ATE) capable of performing a high-speed test by including an accelerator and a decelerator at one end of an FPGA of the ATE body, thereby increasing the maximum operating frequency of the FPGA by at least 2 times, and performing a high-speed test of a device under test (DUT).

In one aspect, an automatic test equipment (ATE) capable of performing a high-speed test, comprises: an ATE body configured to electrically test semiconductor devices; a field programmable gate array (FPGA) controlling drivers and comparators on the ATE; an accelerator connected to an output terminal of the FPGA and that doubles an operating frequency of the FPGA; and a decelerator connected to an output terminal of the FPGA and that converts an operating frequency of data transferred from the semiconductor device to the operating frequency of the FPGA.

The ATE body can comprise: a programmable power supply that supplies power to the drivers and comparators; a direct current (DC) parameter measurement unit connected to the drivers and comparators; an algorithmic pattern generator providing algorithmic patterns to the drivers and comparators; a timing generator connected to the algorithmic pattern generator; a wave shape formatter connected to the algorithmic pattern generator and the timing generator and that provides desired wave shapes to the drivers and comparators; and a pin electronics unit connected to the programmable power supply, the DC parameter measurement unit, and the wave shape formatter and that comprises a plurality of drivers and comparators. The pin electronics unit can be connected to an external chiller to extract the heat generated by the ATE.

The ATE body can test semiconductor devices in a parallel mode. The ATE body can electrically test semiconductor memory devices, for example, comprising a dynamic random access memory (DRAM). The ATE body can also be configured to electrically test a mixed signal semiconductor device including semiconductor memory devices.

The accelerator can be located at the ATE body. The decelerator can be located at the ATE body.

The number (2N) of drivers and comparators of the FPGA can be twice the number (N) of the drivers and comparators of a conventional ATE.

The accelerator can comprise a 2:1 multiplexer (MUX) connected to an output terminal of the FPGA.

The accelerator can further comprise a signal compensation block connected to output signals of the 2:1 MUX.

The signal compensation block can comprise a relay configured to independently set a delay time.

The accelerator can further comprise a skew circuit connected to the 2:1 MUX and that synchronizes first and second signals transferred to the 2:1 MUX. The skew circuit can comprise a relay configured to independently set a delay time.

The decelerator can comprise a 2:1 MUX connected to an output terminal of a device under test (DUT). The decelerator can further comprise a signal compensation block connected to output signals of the 2:1 MUX. The signal compensation block can comprise a relay configured to independently set a delay time. The decelerator can further comprise a de-skew circuit connected to the 2:1 MUX and that synchronizes first and second output signals from the signal compensation block. The de-skew circuit can synchronize the first and second output signals from the 2:1 MUX using a clock signal of a flip-flop circuit.

BRIEF DESCRIPTION OF THE DRAWINGS

The above and other features and advantages of the embodiments of the present invention will become more apparent by describing in detail exemplary embodiments thereof with reference to the attached drawings in which.

DETAILED DESCRIPTION OF EMBODIMENTS

Embodiments of the present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art.

Figure 3:
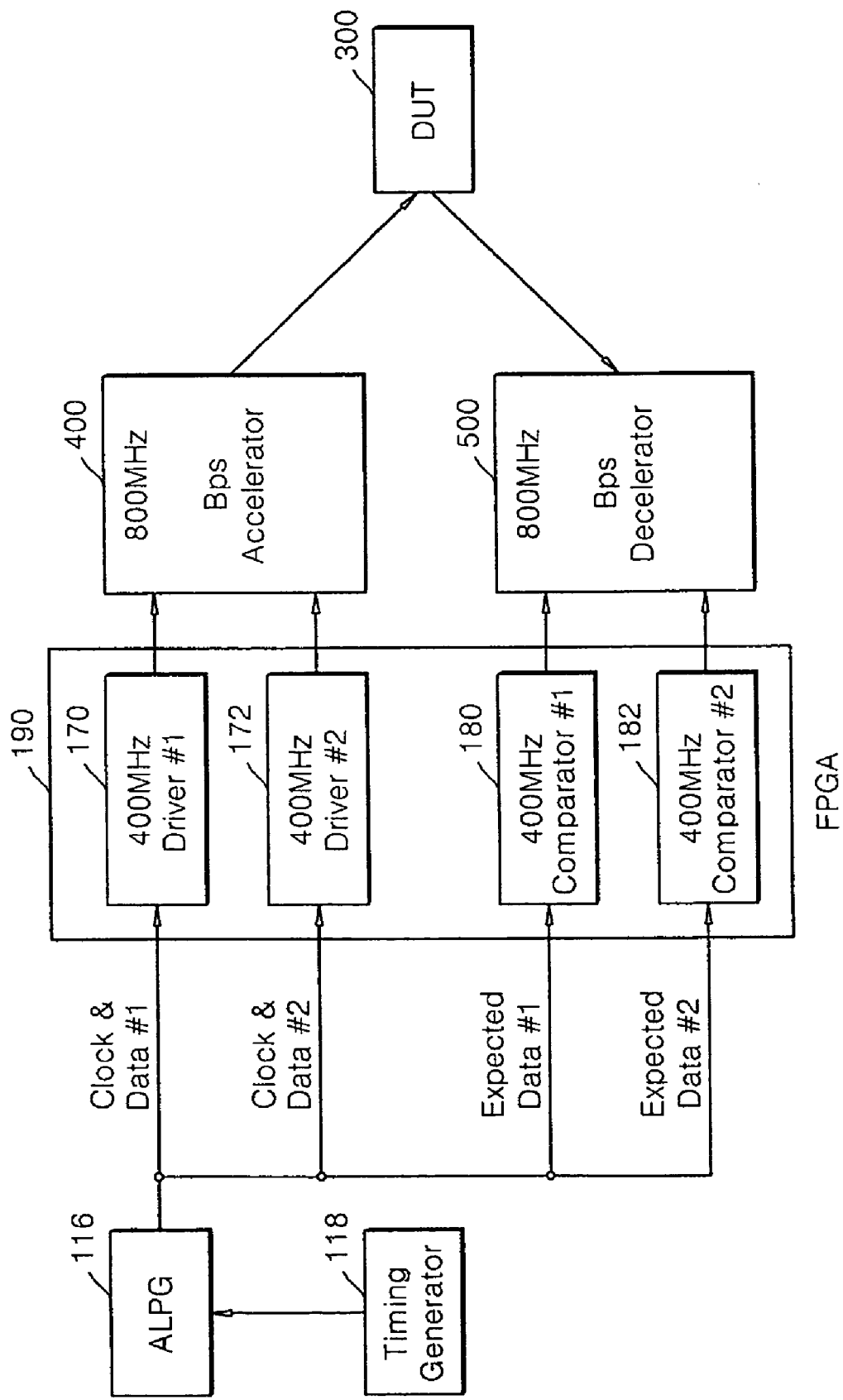
FIG. 3 is a block diagram of a system in which an accelerator and a decelerator are further built into an FPGA capable of controlling drivers and comparators built into an automatic test equipment body according to an embodiment of the present invention.

FIG. 3 is a block diagram of a system in which an accelerator and a decelerator are further configured with an FPGA capable of controlling drivers and comparators of an automatic test equipment body according to an embodiment of the present invention.

Figure 1:
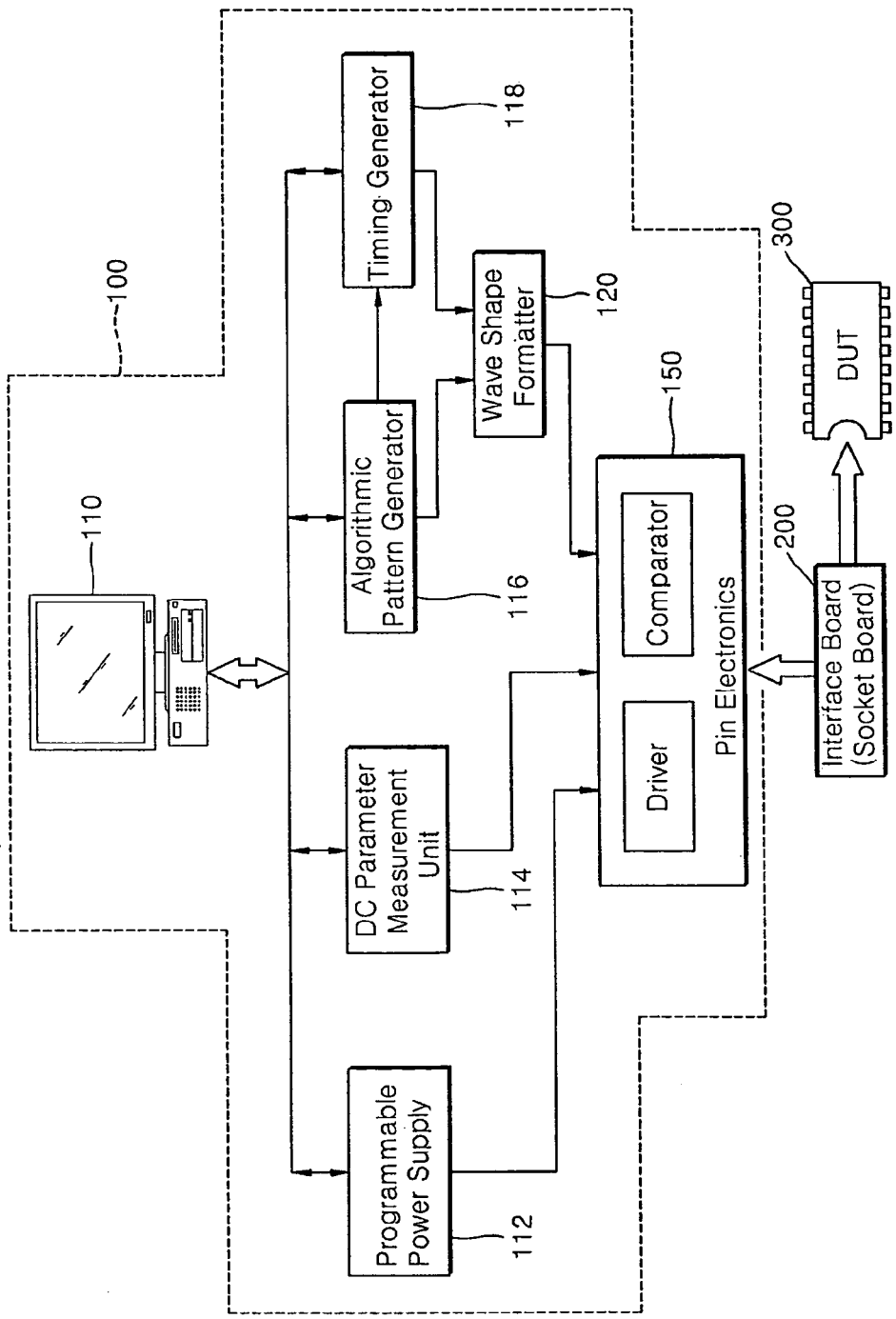
FIG. 1 is a schematic block diagram of an automatic test equipment body for testing a typical semiconductor memory device.

Referring to FIG. 3, an automatic test equipment (ATE) for semiconductor devices capable of performing a high-speed test according to an embodiment of the present invention includes an ATE body 100 (see FIG. 1) electrically testing semiconductor devices, an FPGA 190 controlling drivers 170 and 172 and comparators 180 and 182 built into the ATE body 100, an accelerator 400 which is connected to an output terminal of the FPGA and doubles the operating frequency of the FPGA, and a decelerator 500 which is connected to an output terminal of the FPGA 190 and converts the operating frequency transferred from the semiconductor device to the operating frequency of the FPGA 190.

The ATE body includes a programmable power supply which supplies power to the drivers and comparators, a direct current (DC) parameter measurement unit connected to the drivers and comparators, an algorithmic pattern generator providing algorithmic patterns to the drivers and comparators, a timing generator connected to the algorithmic pattern generator, a wave shape formatter which is connected to the algorithmic pattern generator and the timing generator and provides desired wave shapes to the drivers and comparators, and pin electronics which are connected to the programmable power supply, the DC parameter measurement unit, and the wave shape formatter and include a plurality of drivers and comparators.

Figure 2:
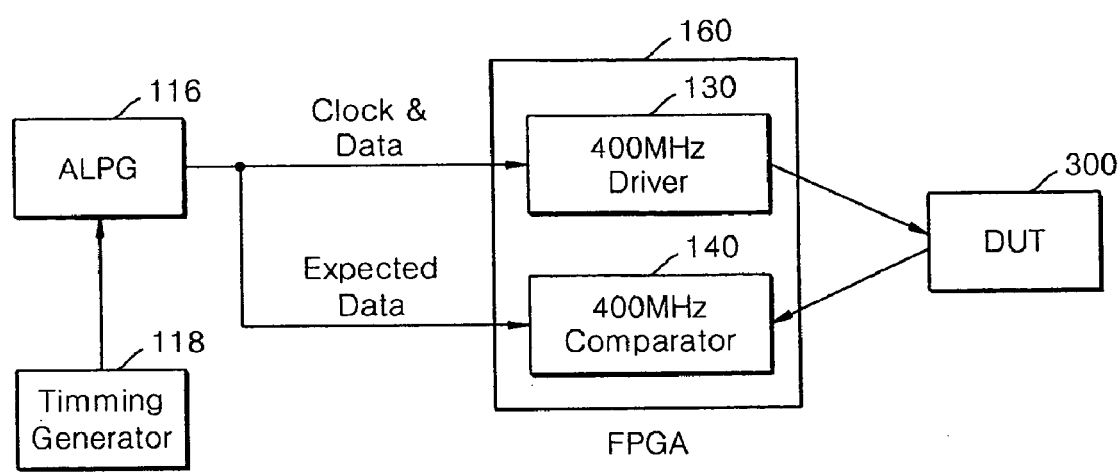
FIG. 2 is a block diagram of an FPGA capable of controlling a driver and a comparator built into a conventional automatic test equipment body.

Meanwhile, the number (2N) of drivers 170 and 172 and comparators 180 and 182 of the ATE for semiconductor devices capable of performing a high-speed test according to the present example embodiment of the present invention is twice the number (N) of the drivers and comparators of the FPGA as illustrated in FIG. 2. The output terminal of the drivers 170 and 172 of the FPGA 190 is connected to the accelerator 400. The accelerator 400 can raise the operating speed of the FPGA 190 to 800 MHz, thereby overcoming the operating speed limitation of the FPGA 190.

In addition, in the ATE for semiconductor devices capable of performing a high-speed test according to an embodiment of the present invention, an output terminal of the comparators 180 and 182 of the FPGA 190 is connected to the decelerator 500. The decelerator 500 converts the operating frequency transferred from the DUT 300 to the operating frequency of the FPGA 190. That is, the operating frequency of 800 MHz, doubled for performing electrical tests, is lowered to 400 MHz by the decelerator 500. Therefore, the DUT 300 can be tested at an increased operating speed of 800 MHz.

The ATE for semiconductor devices capable of performing a high-speed test can be applied to a parallel test of semiconductor memory devices such as a DRAM. The ATE can also be applied to an electrical test of mixed signal semiconductor devices including semiconductor memory devices. Here, the accelerator 400 and the decelerator 500 may be configured directly into the ATE body.

Figure 4:
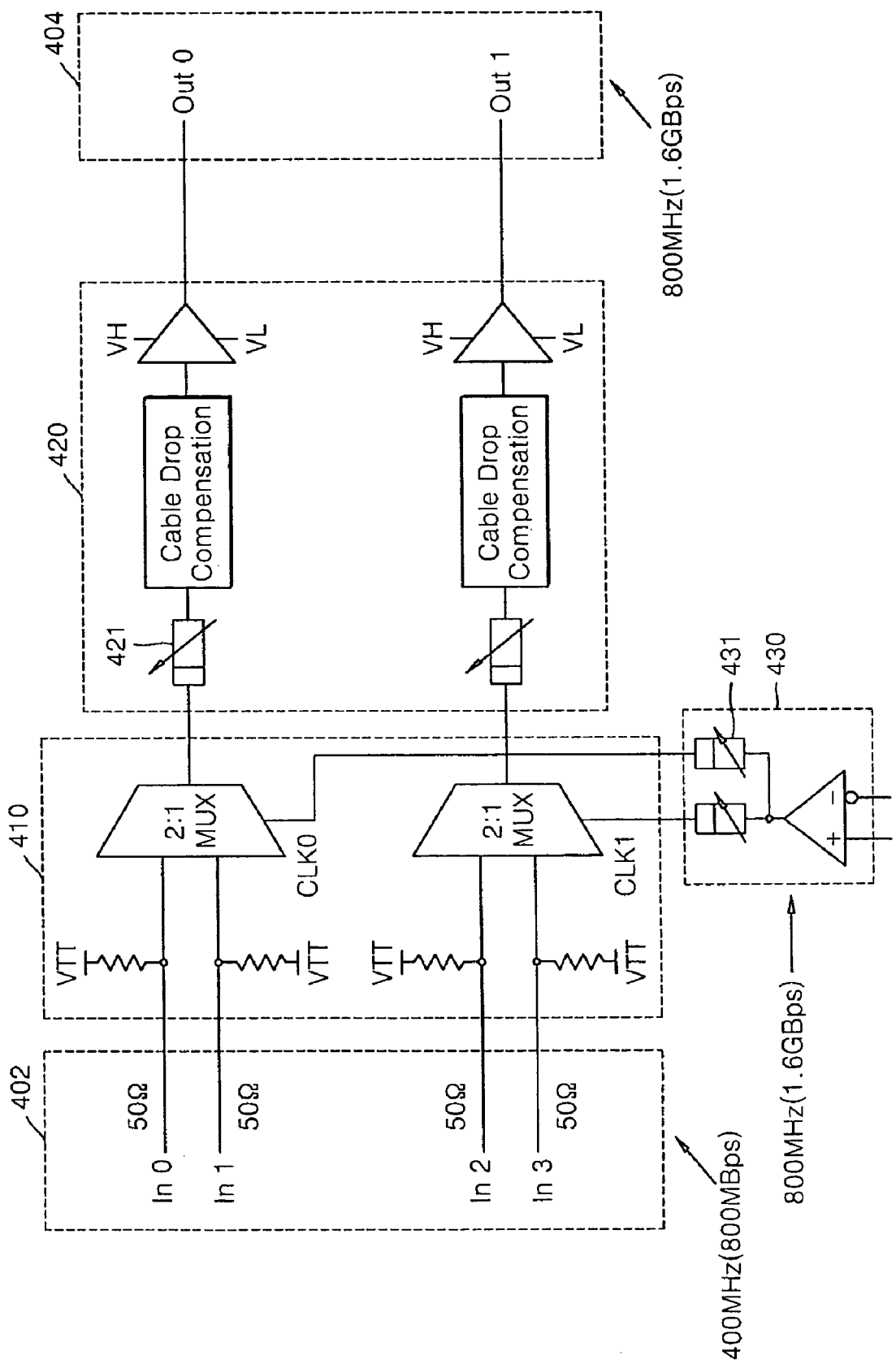
FIG. 4 is a circuit diagram of an embodiment of the accelerator of FIG. 3.

FIG. 4 is a circuit diagram of the accelerator of FIG. 3;

Referring to FIG. 4, the accelerator 400 according to an embodiment of the present invention is connected to an output terminal 402 of drivers of the FPGA semiconductor device. In addition, the accelerator 400 includes a 2:1 multiplexer (MUX) 410, a signal compensation block 420, and a skew circuit 430. The output terminal 404 of the accelerator 400 becomes an input signal transferred to the DUT.

The 2:1 MUX 410 doubles a rate of the input signals, for example, the operating frequency of the output terminal 402 of the drivers of the FPGA semiconductor device. Accordingly, if the operating frequency of the output terminal 402 of the driver of the FPGA is 400 MHz, that frequency is doubled to 800 MHz while passing through the 2:1 MUX 410 in response to the CLK0 and CLK1 signals, and is transferred to the input terminal 404 of the DUT.

The signal compensation block 420 receives the output signals from the 2:1 MUX 410 and compensates the signals processed in the 2:1 MUX 410 to reduce signal distortion. For this, the signal compensation block 420 includes first and second relays 421 which are designed to independently set a delay time.

The skew circuit 430 adjusts two 2:1 MUXs 410 using an external 800 MHz clock to synchronize the two 2:1 MUXs 410. The skew circuit 430 also includes first and second relays 431 which are designed to independently set a delay time.

Figure 5:
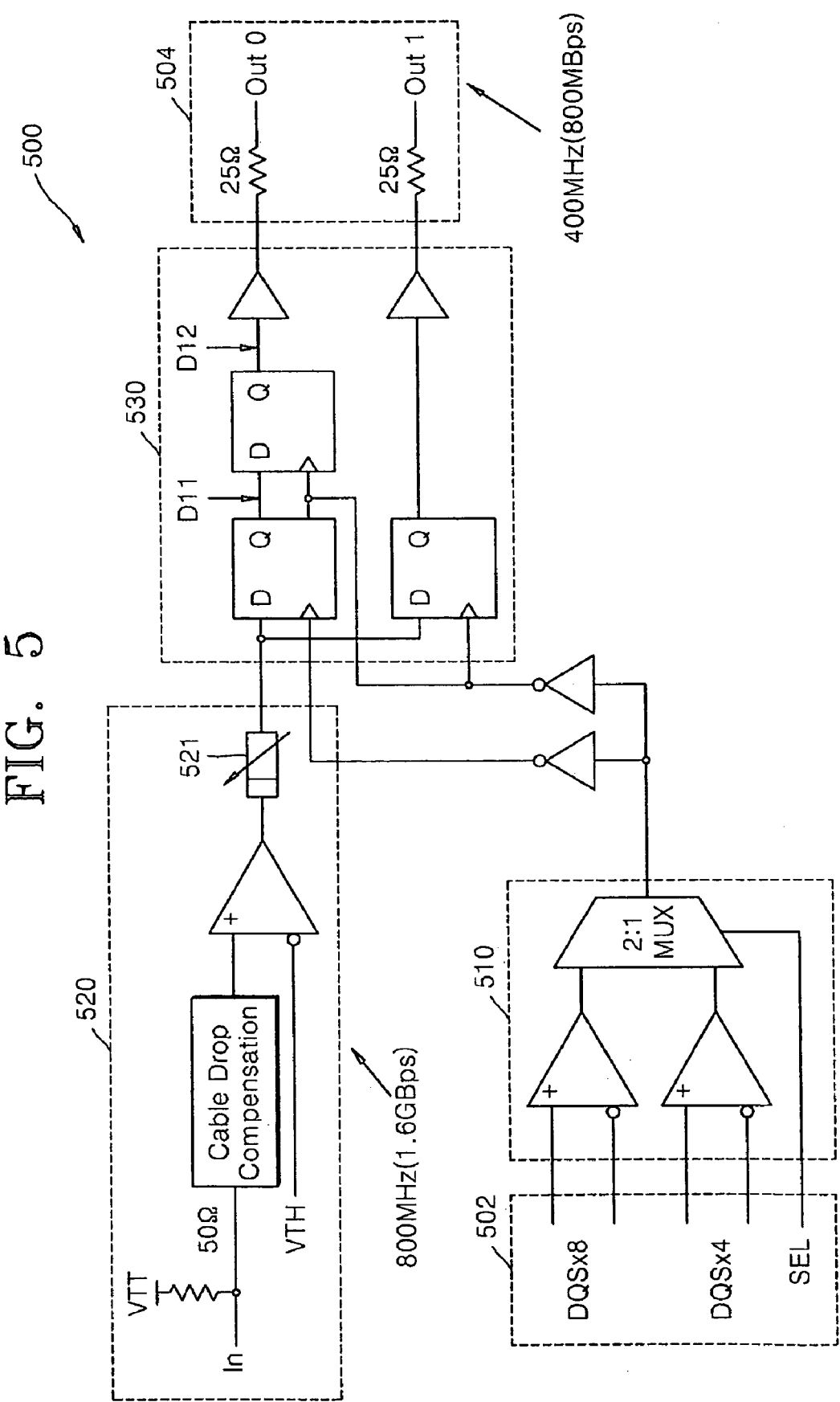
FIG. 5 is a circuit diagram of an embodiment of the decelerator of FIG. 3.

FIG. 5 is a circuit diagram of the decelerator of FIG. 3.

Referring to FIG. 5, in the decelerator 500 according to an embodiment of the present invention, output terminals (DQSX8, DQSX4 and SEL) 502 of a DUT are connected to a 2:1 MUX 510 in the decelerator 500. The decelerator 500 includes a 2:1 MUX 510, a signal compensation block 520 and a de-skew circuit 530. In addition, the output terminal 504 of the decelerator 500 becomes an input signal that is transferred to the comparator of the FPGA.

The 2:1 MUX 510 halves the operating frequency of input signals (DQSX8, DQSX4 and SEL) 502 from 800 MHz to 400 MHz. Thus, the DUT operates at an operating frequency of 800 MHz and the output signals (DQSX8, DQSX4 and SEL) from the DUT are converted to 400 MHz to be synchronized with the original operating frequency of the FPGA while the output signals pass through the 2:1 MUX 510 of the decelerator 500.

The signal compensation block 520 compensates for the loss of output signals from the DUT. For this, the signal compensation block 520 includes a relay 521 which is designed to independently set a delay time.

The skew circuit 530 adjusts operating frequency to the synchronized frequency in a flip-flop circuit, for example 400 MHz, using an output clock signal of the 2:1 MUX 510 and a clock signal transferred from the signal compensation circuit 520.

Figure 6:
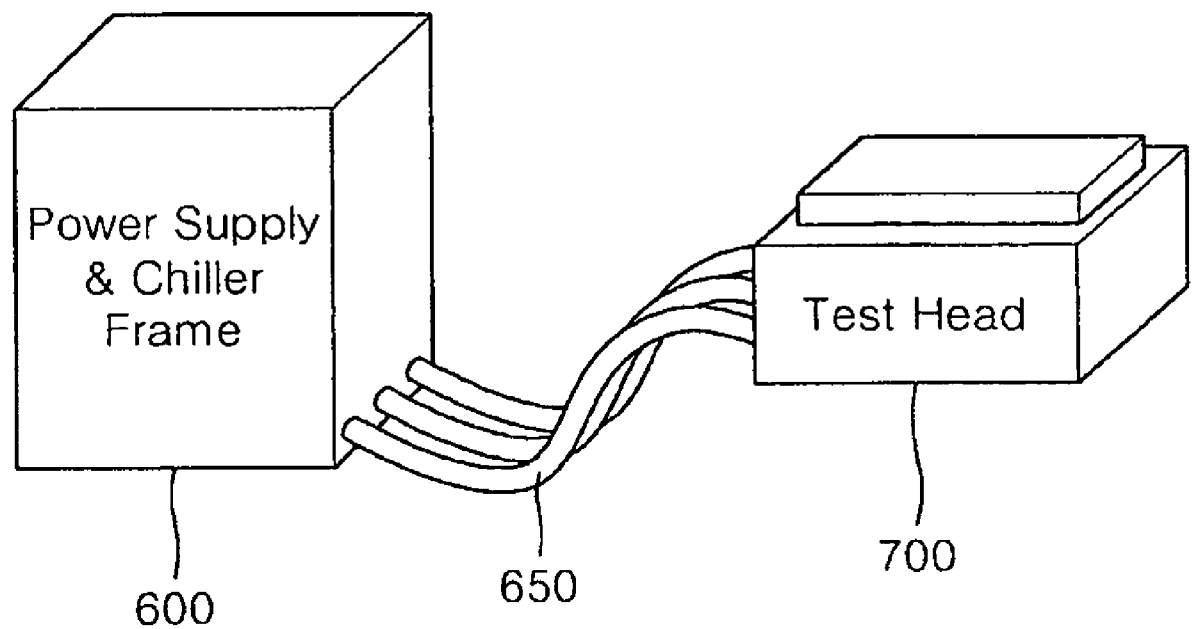
FIG. 6 is a schematic diagram illustrating cooling of pin electronics including drivers and comparators in an automatic test equipment according to an embodiment of the present invention.

FIG. 6 is a schematic diagram illustrating cooling of pin electronics including drivers and comparators in an ATE according to an embodiment of the present invention.

Referring to FIG. 6, the pin electronics including the drivers and comparators is typically located in a test head 700 of the ATE. The FPGA semiconductor device is also located in the pin electronics. The test head 700 is connected to the power supply and a cooling device 600. Accordingly, the test head 700 is cooled via the power supply and interface cables 650 for a cooling device, and thus heat generated while the ATE operates at a high speed can be effectively dissipated.

Therefore, according to the embodiments of the present invention, the operating frequency limit of the FPGA can be overcome by additionally installing an accelerator and decelerator at the output and input of the FPGA in the ATE. The ATE including the FPGA having the operating frequency of 400 MHz can be applied to a test requiring an ATE including the FPGA having an operating frequency of at least 800 MHz, in a cost effective manner. Thus, an effective electrical test can be performed in a cost effective manner by modifying the conventional ATE to test a semiconductor device having a high operating speed, without developing a new ATE.

While embodiments of the present invention has been particularly shown and described with reference to exemplary embodiments thereof, it will be understood by those of ordinary skill in the art that various changes in form and detail may be made therein without departing from the spirit and scope of the present invention as defined by the following claims.

For example, although the above embodiments are described as doubling an operating frequency of the ATE from 400 MHz to 800 MHz, the embodiments of the present invention are not limited to these stated frequencies. Other multiples of the operating frequency, for example, 3×, 4×, and other non-integer multiples, and other operating frequencies, are equally applicable to the principles of the present invention.

What is claimed is:

1. An automatic test equipment (ATE) capable of performing a high-speed test, comprising:
   an ATE body configured to electrically test semiconductor devices;
   a field programmable gate array (FPGA) controlling drivers and comparators on the ATE body;
   an accelerator connected to an output terminal of the FPGA and that doubles an operating frequency of the FPGA, wherein the accelerator comprises a 2:1 multiplexer (MUX) connected to an output terminal of the FPGA; and
   a decelerator connected to an output terminal of the FPGA and that converts an operating frequency of data transferred from the semiconductor device to the operating frequency of the FPGA, wherein the decelerator comprises a 2:1 MUX connected to an output terminal of a device under test (DUT).

2. The ATE capable of performing a high-speed test of claim 1, wherein the ATE body comprises:
   a programmable power supply that supplies power to the drivers and comparators;
   a direct current (DC) parameter measurement unit connected to the drivers and comparators;
   an algorithmic pattern generator providing algorithmic patterns to the drivers and comparators;
   a timing generator connected to the algorithmic pattern generator;
   a wave shape formatter connected to the algorithmic pattern generator and the timing generator and that provides desired wave shapes to the drivers and comparators; and
   a pin electronics unit connected to the programmable power supply, the DC parameter measurement unit, and the wave shape formatter and that comprises a plurality of drivers and comparators.

3. The ATE capable of performing a high-speed test of claim 1, wherein the ATE body tests semiconductor devices in a parallel mode.

4. The ATE capable of performing a high-speed test of claim 1, wherein the ATE body electrically tests semiconductor memory devices.

5. The ATE capable of performing a high-speed test of claim 4, wherein the semiconductor memory device comprises a dynamic random access memory (DRAM).

6. The ATE capable of performing a high-speed test of claim 1, wherein the ATE body is configured to electrically test a mixed signal semiconductor device including semiconductor memory devices.

7. The ATE capable of performing a high-speed test of claim 1, wherein the accelerator is located at the ATE body.

8. The ATE capable of performing a high-speed test of claim 1, wherein the decelerator is located at the ATE body.

9. The ATE capable of performing a high-speed test of claim 1, wherein the number (2N) of drivers and comparators of the FPGA is twice the number (N) of the drivers and comparators of a conventional ATE.

10. The ATE capable of performing a high-speed test of claim 1, wherein the accelerator further comprises a signal compensation block connected to output signals of the 2:1 MUX.

11. The ATE capable of performing a high-speed test of claim 10, wherein the signal compensation block comprises a relay configured to independently set a delay time.

12. The ATE capable of performing a high-speed test of claim 1, wherein the accelerator further comprises a skew circuit connected to the 2:1 MUX and that synchronizes first and second signals transferred to the 2:1 MUX.

13. The ATE capable of performing a high-speed test of claim 12, wherein the skew circuit comprises a relay configured to independently set a delay time.

14. The ATE capable of performing a high-speed test of claim 1, wherein the decelerator further comprises a signal compensation block connected to output signals of the 2:1 MUX.

15. The ATE capable of performing a high-speed test of claim 14, wherein the signal compensation block comprises a relay configured to independently set a delay time.

16. The ATE capable of performing a high-speed test of claim 14, wherein the decelerator further comprises a de-skew circuit connected to the 2:1 MUX and that synchronizes first and second output signals from the signal compensation block.

17. The ATE capable of performing a high-speed test of claim 16, wherein the de-skew circuit synchronizes the first and second output signals from the 2:1 MUX using a clock signal of a flip-flop circuit.

18. The ATE capable of performing a high-speed test of claim 2, wherein the pin electronics unit is connected to an external chiller to extract the heat generated by the ATE.

* * * * *